US 6,683,013 B2

(12) United States Patent
Kim et al.

(10) Patent No.: US 6,683,013 B2
(45) Date of Patent: Jan. 27, 2004

(54) METHOD OF FORMATION FOR QUANTUM DOTS ARRAY USING TILTED SUBSTRATE

(75) Inventors: Eun Kyu Kim, Seoul (KR); Yong Ju Park, Seoul (KR); Hyo Jin Kim, Seoul (KR); Tae Whan Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 10/099,985

(22) Filed: Mar. 19, 2002

(65) Prior Publication Data

US 2002/0168835 A1 Nov. 14, 2002

(30) Foreign Application Priority Data

Mar. 26, 2001 (KR) ........................................ 2001-15609

(51) Int. Cl.⁷ .............................................. H01L 21/00
(52) U.S. Cl. ...................... 438/962; 438/46; 438/478; 438/507
(58) Field of Search ................................ 216/2, 24, 39; 257/9, 11, 12, 14, 22; 372/45; 438/22–24, 44, 46, 47, 478, 507, 705, 800, 962

(56) References Cited

U.S. PATENT DOCUMENTS 4,987,094 A * 1/1991 Colas et al. ................ 257/185
5,229,320 A 7/1993 Ugajin
5,281,543 A * 1/1994 Fukuzawa et al. ........... 438/186
5,482,890 A 1/1996 Liu et al.
6,329,668 B1 * 12/2001 Razaghi ....................... 257/14

OTHER PUBLICATIONS

Park et al., "Formation of InAs quantum dots on GaAs(100) by chemical beam epitaxy", Journal of the Korean physical Society, vol. 31 (3), p. 537–540 (1997).*
Oswald et al., "Study of InAs quantum dots in GaAs prepared on misoriented substrates", Thin Solid Films, vol. 336, p. 80–83 (1998).*

* cited by examiner

Primary Examiner—Kamand Cuneo
Assistant Examiner—Asok Kumar Sarkar
(74) Attorney, Agent, or Firm—Oliff & Berridge, PLC

(57) ABSTRACT

Disclosed is a method of forming a quantum dots array. In the method of the present invention, a structure of wire-like quantum dots with good quality is formed in materials having an inconsistency in the lattice constant on a tilted substrate by using the binding property of atomic bonding due to chemical bonding steps of the tilted substrate, and the spacing of the wire-like quantum dots is varied by using the step width of the tilted substrate which is transformed due to a partial pressure of a source gas and the thickness of a buffer layer. The invention allows materials having an inconsistency in the lattice constant to be freely formed in the form of quantum wires with a growing technique only and accordingly to be used as base materials in use for manufacture of novel concept of optoelectronic devices which have not been obtained so far.

1 Claim, 6 Drawing Sheets 500 nm 500 nm

METHOD OF FORMATION FOR QUANTUM DOTS ARRAY USING TILTED SUBSTRATE

BACKGROUND OF THE INVENTION

1. Field of the Invention

The present invention relates to methods of formation for a quantum dots array, and more specifically, to a method of formation for a quantum dots array using a tilted substrate.

2. Description of the Related Art

As well known to those skilled in the art, excellent quantum wires cannot be formed between materials having different lattice constants. In this case, defects such as misfit and threading dislocations are created within a thin film, which degrade crystallographic and optical properties of the thin film. For example, quantum wells or quantum wires can be rarely grown without defects by forming InAs or InP on a GaAs substrate. This is because InAs or InP layer has a lattice constant different from that of GaAs substrate. So, such inconsistency of the lattice constants allows spontaneous formation of quantum dots.

In the meantime, manufacture of quantum functional devices has very important factors, i.e. uniformity and location of quantum structures. However, in quantum structure formation techniques using conventional mask or lithographic methods, those processes are sophisticated and surface defects can frequently be generated as drawbacks. In order to overcome such disadvantages, a number of studies have been investigated on the Stranski-Krastanow (S-K) growth mode which provides a quantum structure forming method based upon the difference of lattice constants between two materials. However, this mode also has problems to be solved such as location and size-control of the quantum dots.

SUMMARY OF THE INVENTION

Accordingly, the present invention has been proposed to solve the foregoing problems and it is an object of the present invention to provide a method of forming a quantum dots array in which a structure of wirelike quantum dots with good quality is formed in materials having an inconsistency in the lattice constants using a tilted substrate.

To accomplish the object and other advantages, there is provided a method of forming a quantum dots array. The method comprises the steps of: preparing a substrate having a constant crystallographic axis and a surface tilted with respect to the crystallographic axis; forming a buffer layer on the substrate by a chemical vapor deposition, the buffer layer being made of the same material as the substrate; and growing a material layer having a lattice constant which is different from that of the substrate, wherein a partial pressure of a source gas, a thickness of the buffer layer and a thickness of the material layer are adjusted during the chemical vapor deposition of the buffer layer so that sizes of quantum dots are restricted in a direction perpendicular to a step line direction due to an atomic bonding of step binding and the sizes of the quantum dots increase in a direction parallel to the step line direction, thereby obtaining quantum wires of good quality.

DETAILED DESCRIPTION OF THE PREFERRED EMBODIMENT

The following detailed description will present a method of forming a quantum dot array in accordance with a preferred embodiment of the present invention, in which the features of the quantum dot array formed according to the embodiment will be discussed in reference to the accompanying drawings.

First, a (100) GaAs substrate tilted for 2 degrees in [010] direction is prepared and cleaned with organic substances such as TCE (trichloroethylene), acetone and methanol. Then, after being etched for one minute in a mixed etching solution having a mixing ratio of $H_2SO_4:H_2O_2:H_2O=5:1:1$, the substrate is loaded into a vertical reactor of a growing apparatus. The growing apparatus employed in the invention forms a film via the AP-MOCVD, by which a GaAs buffer layer is grown into a thickness of about 70 monolayers on the 2 degree-tilted (100) GaAs substrate at a growth temperature of about 700° C. During a growth process, GaAs has a growth rate of about 0.8 monolayer and $AsH_3$ has a partial pressure of about $1.2\times10^{-3}$ atm. Then, after the growing temperature is lowered to about 430° C., an InAs layer is grown with a V to III ratio of 200. The grown InAs layer is converted into a thickness of 2 to 2.4 monolayers. TMG (trimethylgallium), TMI (trimethylindium) and $AsH_3$ (arsine) are supplied with flow rates of 3.0, 1.1 and 223.2 $\mu$mol/min, respectively. A $H_2$ carrier gas has a total flow rate of 5l/min. After the InAs layer is grown, growth is interrupted for 30 seconds and then the temperature is lowered to a room temperature. An atomic force microscope (AFM) is used to inspect the surface shapes of the InAs layer due to various growth thicknesses.

Figure 1A:
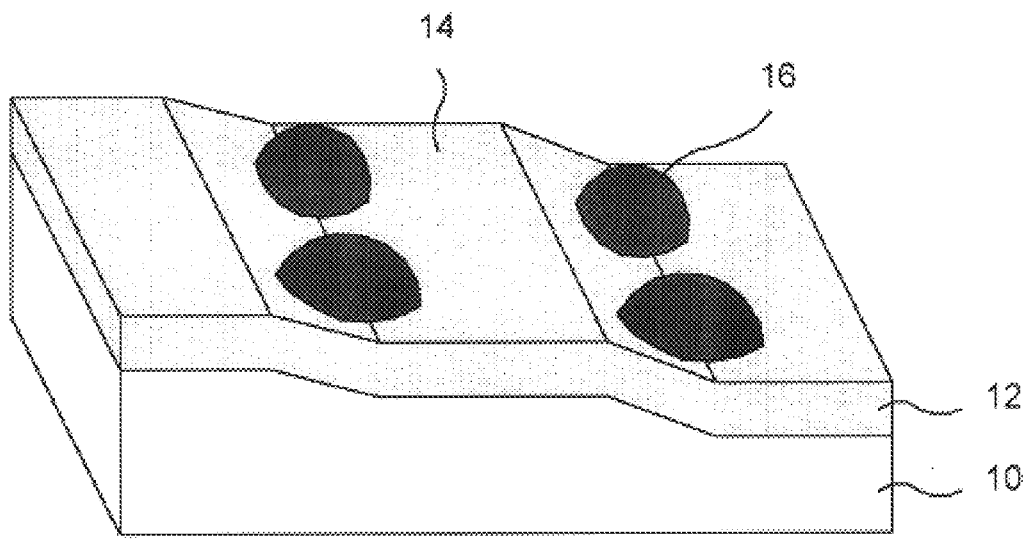
FIGS. 1A and 1B are perspective views schematically showing the shapes of InAs quantum dots, which are transformed by varying the thickness of a GaAs layer grown on a 2 degree-tilted (100) GaAs substrate.
Figure 1B:
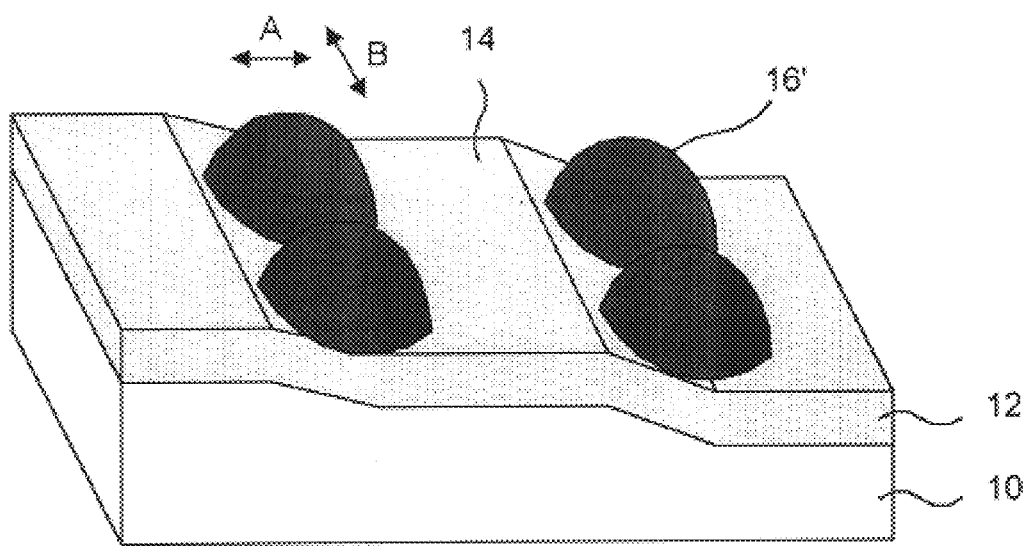

FIGS. 1A and 1B are perspective views illustrating the shapes of InAs quantum dots, which are transformed by varying the thickness of a GaAs layer grown on a 2 degree-tilted (100) GaAs substrate.

Referring to FIGS. 1A and 1B, a GaAs buffer layer 12 is formed on a 2 degree-tilted (100) GaAs substrate 10 having a terrace 14, and thickness of an InAs layer formed there on increases. Referring to FIG. 1A that is relatively small in increase in the thickness of the InAs layer and FIG. 1B that is relatively large in increase in the thickness of the InAs layer, sizes of InAs quantum dots 16 increase in a direction parallel to a GaAs atomic step line due to binding property of the atomic bonding while the sizes of the InAs quantum dots 16 and 16' are saturated in a direction perpendicular to the GaAs atomic step line. Thus, due to the increase in the sizes of the InAs quantum dots in the direction parallel to the atomic step line as above, the InAs quantum dots are closely positioned to each other, so that it becomes possible to fabricate a quantum dot array in the shape of quantum wires.

Figure 2:
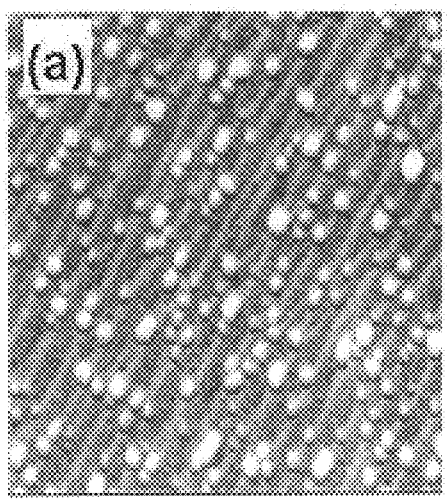
FIG. 2 is 1×1 $\mu m^2$ AFM images of surfaces of an InAs layer grown on a 2 degree-tilted (100) GaAs substrate, when the thickness of the InAs layer grown on the GaAs substrate is (a) 2 monolayers (ML), (b) 2.2 monolayers, (c) 2.3 monolayers, and (d) 2.4 monolayers (ML), respectively.
Figure 2:
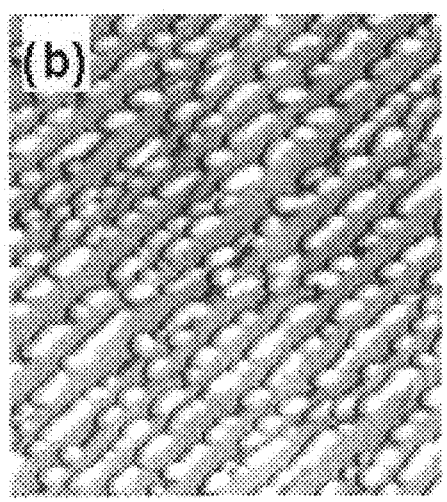
Figure 2:
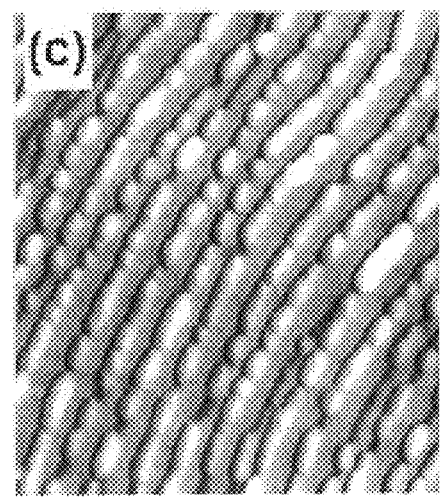
Figure 2:
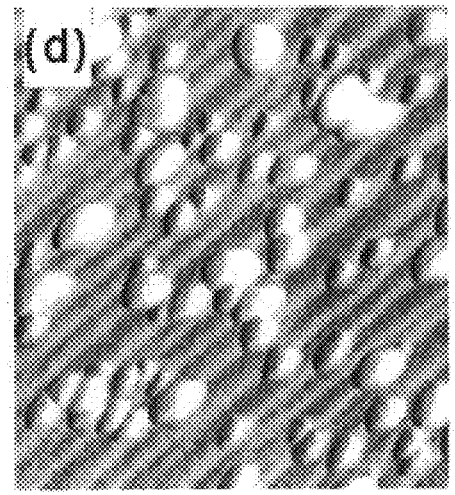

FIG. 2 is AFM images showing the surface shapes of InAs quantum dots which are grown on the 2 degree-tilted (100) GaAs substrate 10 when the thickness of an InAs layer is varied from 2 monolayers to 2.4 monolayers.

Referring to FIG. 2, all of the InAs quantum dots grown on the 2 degree-tilted (100) GaAs substrate are arranged along the step lines. In FIG. 2, the InAs layers shown in (a) to (d) have the thicknesses of 2, 2.2, 2.3 and 2.4 monolayer (ML), respectively. FIGS. 2(a) to 2(c) clearly show the growth of the quantum dots arrayed in the form of quantum wires (i.e., wirelike quantum dots), which are obtained when increasing the thickness of the InAs layer as described in FIGS. 1A and 1B. However, when the InAs layer has the thickness of 2.4 monolayers or more, as shown in FIG. 2(d), the quantum dots are not made in the form of quantum wires. This is because when the InAs layer has the thickness of 2.4 monolayers or more, the binding property of atomic bonding due to steps relatively decreases on the 2 degree-tilted (100) GaAs substrate.

Figure 3:
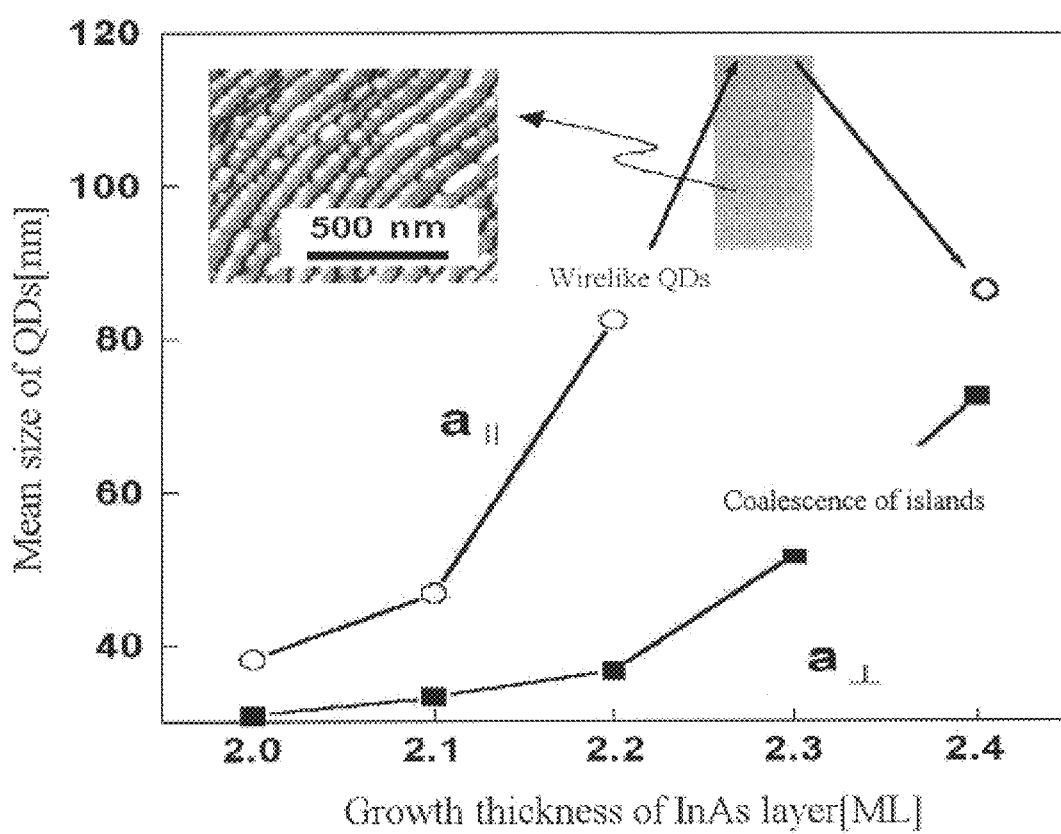
FIG. 3 is a graph for illustrating size variation of the quantum dots in a perpendicular direction $a_{195}$ and a parallel direction $a_\parallel$ to a step line of a 2 degree-tilted (100) GaAs substrate, when the thickness of the InAs layer is varied.

FIG. 3 illustrates size variation of the quantum dots in a perpendicular direction $a_{195}$ and a parallel direction $a_{\|}$ to the atomic step line, when the growth thickness of InAs is varied with respect to FIG. 2.

When the thickness of the InAs layer is 2, 2.1, 2.2, 2.3 and 2.4 monolayers respectively, the sizes of the quantum dots are 30.8, 33.2, 36.6, 52.9 and 72.4 nm in the direction perpendicular to the step lines, and are 38.1, 46.7, 82.5, ∞ and 89 nm in the direction parallel to the step lines, respectively.

The step width due to chemical bonding of the 2 degree-tilted (100) InAs substrate is transformed due to a bunching effect caused by diffusion of GaAs atoms during growth of the GaAs layer. The bunching effect is based upon a probability that Ga atoms may coalesce into upper and lower side portions of the steps due to the atomic chemical bonding proposed by Schowebel et al. Assuming $E_{up}$, $E_{down}$ and $E_{terrace}$ as surface energy barriers when the Ga atoms move toward the upper side portion, toward the lower side portion and onto the atomic step surface, respectively, and $\Delta E_{up}$ and $\Delta E_{down}$ as $E_{up}-E_{terrace}$ and $E_{down}-E_{terrace}$, respectively, the variation rate in the step width is changed according to the difference in this probability. Factors of $\Delta E_{up}$ and $\Delta E_{down}$ can be adjusted due to pre-annealing, a partial pressure of $AsH_3$ and a growth thickness of an InAs buffer layer in experiments.

Figure 4A:
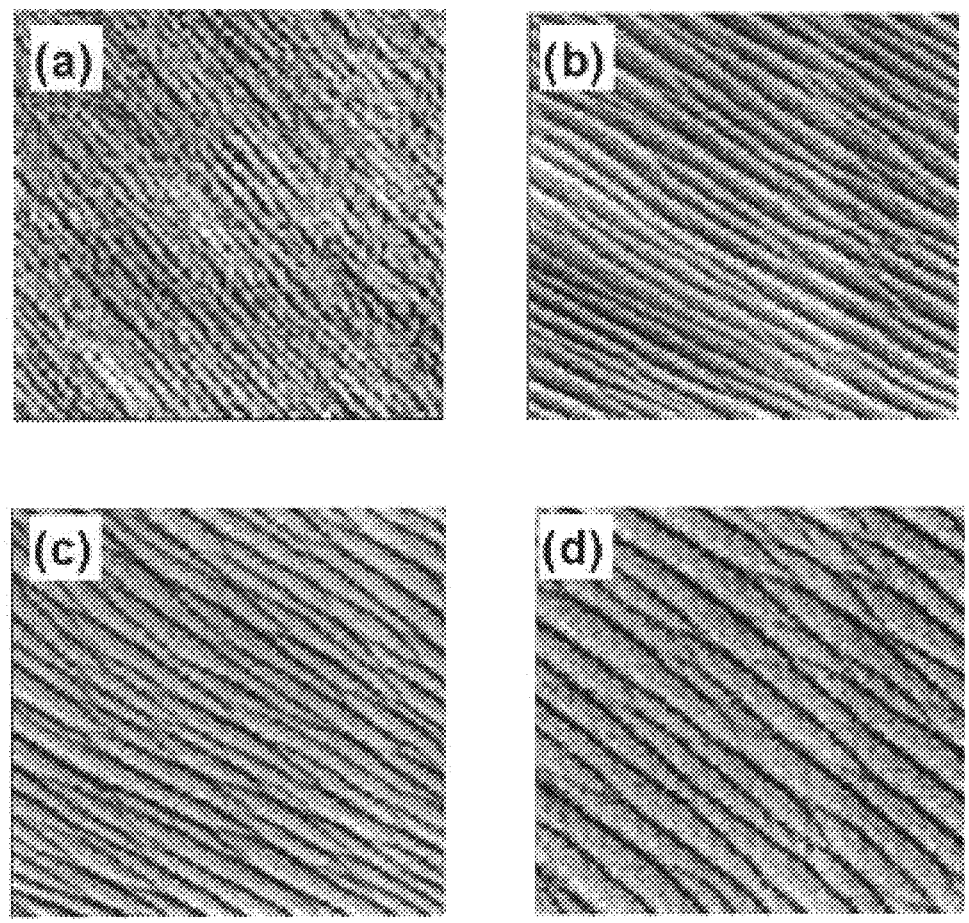
FIGS. 4A and 4B views for illustrating a variation in the spacing between step layers due to a bunching effect of Ga atoms varied according to the thickness of a GaAs buffer layer grown on a 2 degree tilted (100) GaAs substrate.

FIG. 4A illustrates the shapes related to the step widths of a 2 degree-tilted (100) GaAs substrate which is transformed by varying the growth thickness of a GaAs buffer layer at a high $AsH_3$ partial pressure of about $1.2\times10^{-3}$ atm.

Figure 4B:
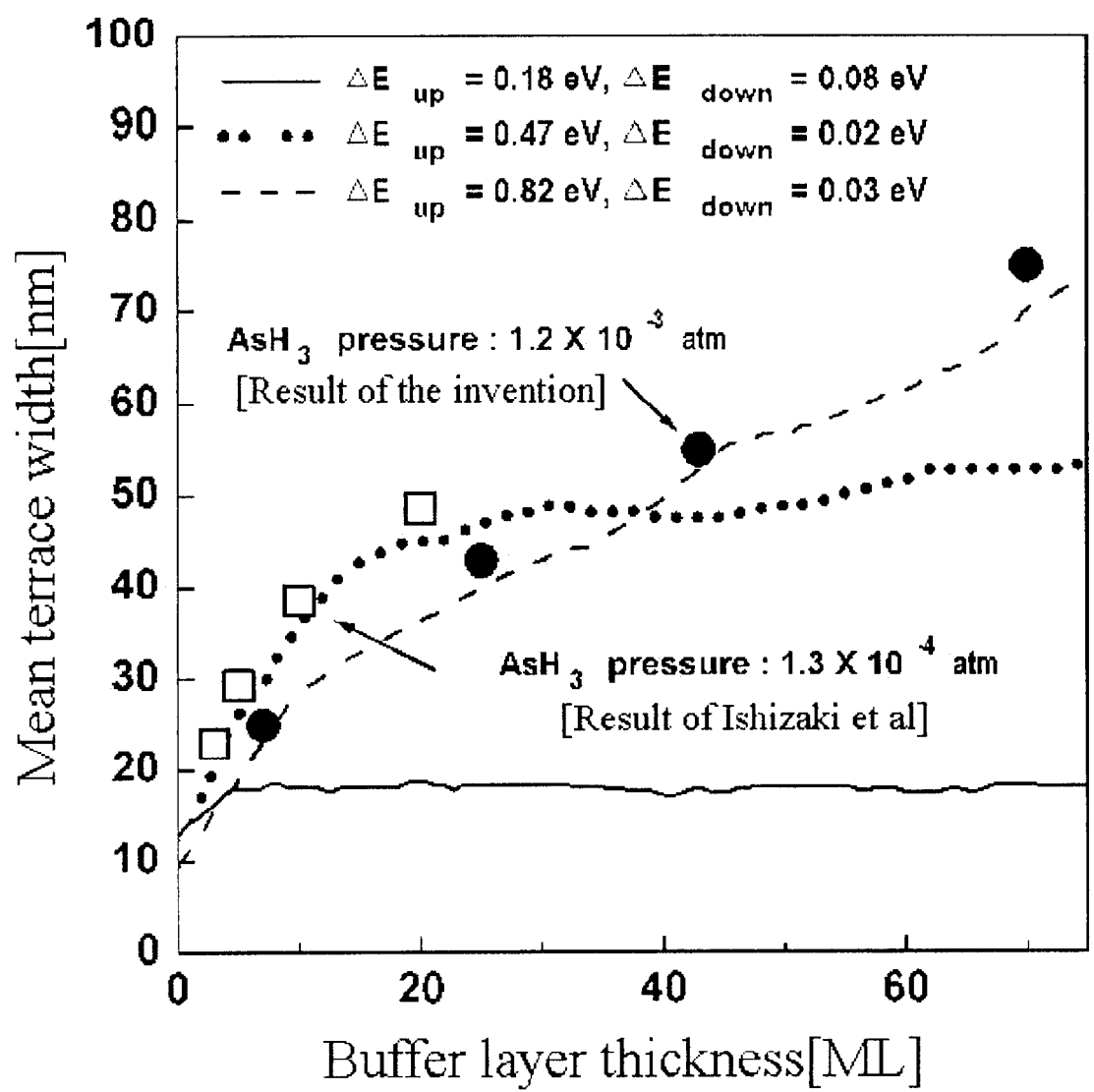

FIG. 4B are a graph of lines illustrating simulation results of the step width of the 2 degree-tilted (100) GaAs substrate about the GaAs buffer layer obtained as $\Delta E_{up}$ and $\Delta E_{down}$ are varied, in which an experiment result of the invention is coincident with conditions where $\Delta E_{up}$ is 0.82 eV and $\Delta E_{down}$ is 0.03 eV. In this case, $AsH_3$ has a partial pressure of $1.2\times10^{-3}$ atm, which is adopted in order to obtain more linear variation in the step width according to the thickness of the buffer layer. An experimental result of such variation can be expressed according to Equation 1:

$$W_t = W_i + 95(1-\exp(-0.012t_g))(nm) \quad \text{Equation 1,}$$

where $W_i$ means the initial step width, $W_t$ means the atomic step width caused by the bunching effect and $t_g$ means the thickness of the GaAs buffer layer. In the 2 degree-tilted GaAs substrate, $W_i$ is about 12.1 nm but may have a variation of ±5 nm due to a pre-annealing effect. However, if ΔEup is 0.47 eV and $\Delta E_{down}$ is 0.02 eV, $AsH_3$ has a partial pressure of $1.3\times10^{-4}$ atm (refer to *Appl. Phys.*, 35, 1280 (1996) by J. Ishizaki, K. Ohkuri and T. Fukui, and *Cryst. Growth*, 160, 235 (1996) by K. Ohkuri, J. Ishizaki, S. Hara and T. Fukui, J.), in which the atomic step width shows a sharp variation until the GaAs buffer layer has a thickness of about 18 monolayers, and then the variation is significantly slowed down. An experimental result of such variation can be expressed according to Equation 2:

$$W_t = W_i + 39(1-\exp(-0.086t_g))(nm) \quad \text{Equation 2.}$$

According to the present invention, as the wirelike InAs quantum dots are realized on each of the 2 degree-tilted (100) GaAs substrates with the step widths transformed due to the bunching effect, the spacing of the InAs quantum dots arranged in the form of quantum wires can be adjusted.

Figure 5:
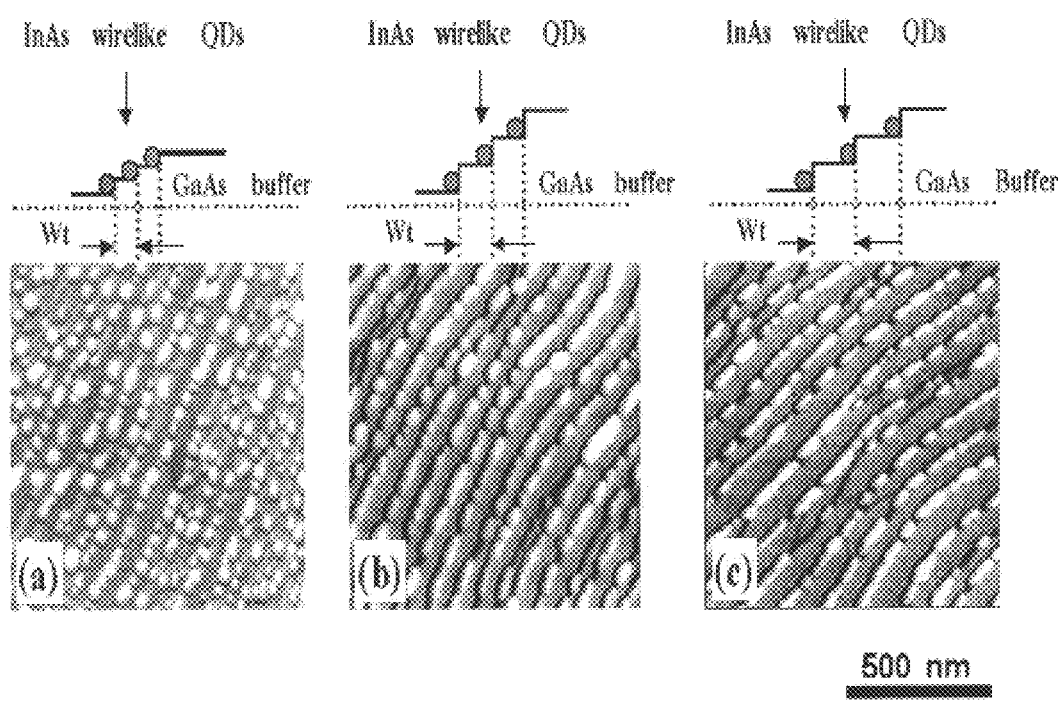
FIG. 5 is 1×1 $\mu m^2$ AFM images illustrating InAs quantum dots arrays formed on GaAs buffer layers which are grown to the thickness of (a) 43, (b) 70 and (c) 120 monolayers on a 2 degree-tilted (100) GaAs substrates, in which the InAs layers have thicknesses of (a) 2.0, (b) 2.3 and (c) 2.5 monolayers, respectively.

FIG. 5 is AFM images illustrating InAs quantum dots transformed in the form of quantum wire on GaAs buffer layers which are grown up to the thickness of (a) 43, (b) 70 and (c) 120 monolayers on the 2 degree-tilted (100) GaAs substrates. In this case, the InAs layers have the optimum growth thickness of (a) 2.0, (b) 2.3 and (c) 2.5 monolayers for the purpose of obtaining the arrayed InAs quantum dots, and the transformed step widths of the 2 degree-tilted (100) GaAs substrates are 55, 75 and 91 nm, respectively.

As critical technologies of the invention, one is that it is possible to form InAs having a different lattice constant than that of the GaAs substrate in the form of quantum wires on the GaAs substrate by using the binding property of atomic bonding due to chemical bonding steps of the (100) GaAs tilted in [100] direction, and another one is that the spacing of the InAs quantum dots transformed in the form of quantum wire is varied by using the step width of the tilted (100) GaAs substrate which is transformed by adjusting the bunching effect of the tilted (100) GaAs substrate due to the partial pressure of $AsH_3$ and the thickness of the GaAs buffer layer.

Further, such technologies utilize variously tilted substrates having atomic step widths, which are transformed due to the bunching effect of about 20 nm or more addition to the 2 degree-tilted (100) GaAs substrate. In this case, each of the initial step widths $W_i$ according to the various tilt angles of the (100) GaAs substrates can be expressed according to Equation 3:

$$W_i \cong \frac{3a_{GaAs}}{4\tan\theta_i} \quad \text{Equation 3,}$$

where $\alpha_{GaAs}$ is the lattice constant of GaAs and $\theta_i$ is the tilt angle of the substrate.

For example, substrates which are tilted for 1, 2, 3, 4 and 5 degrees have the initial step widths of 24.2, 12.1, 8.0, 6.0 and 4.8 nm, respectively. Therefore, in the GaAs (100) substrates having the tilt angles of 3 degree or more, the spacing of quantum dot arrays can be hardly discriminated by using the initial substrates only. However, using the bunching effect due to the partial pressure of $AsH_3$ and the thickness of the GaAs buffer layer from Equations 1 and 2 allows the transformed tilted substrate has an angle $\theta_i$ as in Equation 4 to obtain an angle smaller than the tilt angle of the initial substrate and increases the transformed atomic step widths so that the spacing of the quantum dot arrays can be sufficiently discriminated.

$$\theta_f \cong \tan^{-1}\left(\frac{4W_i}{3a_{GaAs}}\right) \qquad \text{Equation 4.}$$

However, if the initial tilt angle of the tilted substrate is too large, the difference between $\Delta E_{up}$ and $\Delta E_{down}$ is too small thereby rarely having the bunching effect. Therefore, the substrates with the tilt angle ranging from 1 to 8 degrees can be used, in which the initial step width of the tilted substrate is at least 5 times of the lattice constant of GaAs.

Further, the foregoing technical principle of the present invention can be applied not only to formation of InAs on the GaAs substrate into the shape of quantum wires but also to formation of InGaAs on the tilted GaAs substrate, and InGaAs on a tilted InP substrate into the shape of quantum wires, in which the foregoing materials have inconsistent lattice constants. In other words, application of the inventive technique allows those materials having different lattice constants to be formed into the shape of quantum wires and dots and accordingly to be used as base materials in use for manufacture of novel concept of optoelectronic devices which have not been obtained so far.

Although the preferred embodiments of the present invention have been disclosed for illustrative purposes, those skilled in the art will appreciate that various modifications, additions and substitutions can be made without departing from the scope and spirit of the invention as disclosed in the accompanying claims.

What is claimed is:

1. A method of forming a quantum dot array, the method comprising the steps of:

preparing a substrate having a constant crystallographic axis and a (100) GaAs surface tilted from 1 to 8 degrees with respect to the crystallographic axis;

forming a GaAs buffer layer on the substrate by a chemical vapor deposition or chemical beam epitaxy, the buffer layer being made of the same material as the substrate; and growing an InAs material layer having a lattice constant which is different from that of the substrate, wherein partial pressure of $AsH_3$ source gas is adjusted to $1.2\times10^{-3}$ atm, and a thickness of the GaAs buffer layer is adjusted to range from 43 to 120 monolayers and the thickness of the InAs material layer is adjusted to range from 2 to 2.5 monolayers during the formation of the buffer layer and the material layer so that sizes of quantum dots are restricted in a direction perpendicular to a step line direction due to an atomic bonding of step binding and the sizes of the quantum dots increase in a direction parallel to the step line direction, thereby obtaining quantum wires or chained quantum dots or 1-dimensionally arrayed quantum dots arrayed of good quality.

* * * * *